United States Patent [19]

Wildes et al.

[11] Patent Number: 5,730,113
[45] Date of Patent: Mar. 24, 1998

[54] DICING SAW ALIGNMENT FOR ARRAY ULTRASONIC TRANSDUCER FABRICATION

[75] Inventors: Douglas Glenn Wildes, Ballston Lake; Kenneth Brakeley Welles, II, Scotia; William Paul Kornrumpf, Albany, all of N.Y.

[73] Assignee: General Electric Company, Schenectady, N.Y.

[21] Appl. No.: 570,223

[22] Filed: Dec. 11, 1995

[51] Int. Cl.⁶ .................................................. B28D 1/04
[52] U.S. Cl. .................. 125/13.01; 29/25.35; 29/600
[58] Field of Search .................................. 125/13.01, 12; 29/25.35, 600; 367/153, 155, 140; 128/662.03; 73/642, 861.27

[56] References Cited

U.S. PATENT DOCUMENTS

| | | | |
|---|---|---|---|
| 4,411,052 | 10/1983 | Kampf | 29/25.35 |
| 4,869,768 | 9/1989 | Zola | 156/245 |
| 5,091,893 | 2/1992 | Smith et al. | 367/153 |
| 5,099,459 | 3/1992 | Smith | 29/25.35 |
| 5,402,791 | 4/1995 | Saitoh et al. | 128/622.03 |
| 5,423,220 | 6/1995 | Finsterwald et al. | 73/642 |
| 5,511,550 | 4/1996 | Finsterwald | 128/662.03 |
| 5,548,564 | 8/1996 | Smith | 367/140 |
| 5,637,800 | 6/1997 | Finsterwald et al. | 73/642 |

OTHER PUBLICATIONS

Product Brochure ASK 77.5.3000, "DAD–2H/5 Disco Automatic Dicing Saw", Disco Abrasive Systems, Inc., Mountain View, CA.

*Primary Examiner*—James G. Smith
*Assistant Examiner*—Derris H. Banks
*Attorney, Agent, or Firm*—Marvin Snyder

[57] ABSTRACT

An array ultrasonic transducer precursor includes a body of piezoelectric material with a dielectric substrate bonded to a surface of the body. Circuit elements supported on the dielectric substrate include, in an active region, physically parallel signal conductors arranged in a pattern with spaces between adjacent ones of the conductors. Dicing saw cuts made in these spaces define individual circuit elements within the piezoelectric body. The circuit elements outside the active region include a set of resistive alignment elements in predetermined positions with reference to the pattern of signal conductors. The transducer precursor is mounted in a dicing saw fixture, and initial cuts made with the dicing saw remove portions of the resistive alignment elements. Locations of the initial cuts with reference to the resistive alignment elements are determined by measuring resistances of the resistive alignment elements after the initial cuts.

7 Claims, 9 Drawing Sheets

DICING SAW ALIGNMENT FOR ARRAY ULTRASONIC TRANSDUCER FABRICATION

BACKGROUND OF THE INVENTION

This invention relates to phased array ultrasonic transducers and, more particularly, to alignment of a dicing saw employed to define elements of an array ultrasonic transducer.

Array ultrasonic transducers, employed for example in medical applications, rely on wave interference for their beam forming effects, and typically employ a plurality of individual transducer elements organized as either a one-dimensional (linear) array or a two-dimensional array. Ultrasound is used as a non-invasive technique for obtaining image information about the structure of an object which is hidden from view, and has become widely known as a medical diagnostic tool. Ultrasound is also used for non-destructive testing and analysis in the technical arts. Medical ultrasonic transducer arrays typically operate at a frequency within the range of one MHz to ten MHz, although higher frequencies are certainly possible. A two-dimensional phased array of ultrasonic transducer elements is often designed to obtain image data in two or three dimensions, without requiring movement of the array transducer.

Medical ultrasonic transducer arrays conventionally are fabricated from a block of ceramic piezoelectric material within which individual elements are defined and isolated from each other by sawing at least partially through the block of piezoelectric material, making a number of cuts with a dicing saw.

More particularly, in the fabrication of a two-dimensional array, as a preliminary step a dicing saw is employed to make several isolation cuts (for example from three to eight isolation cuts) most of the way through the block of piezoelectric material to define isolated rows or subarrays. Subsequently, a second series of many (for example approximately 128) dicing saw cuts are made at right angles to the isolation cuts, typically all the way through the block of piezoelectric material, to define individual piezoelectric array elements within each row or subarray. Each resultant piezoelectric element is acoustically and electrically isolated from its neighbors.

The dicing saw cuts are made with specialized equipment, in particular an automatic dicing saw intended for precision cutting of electronic materials including silicon, glass, and ceramics with a diamond abrasive saw blade.

One approach to providing individual electrical signal connections to the small piezoelectric elements defined by dicing is disclosed in Smith et al. U.S. Pat. No. 5,091,893, issued Feb. 25, 1992 and assigned to the instant assignee. The entire disclosure of U.S. Pat. No. 5,091,893 is hereby expressly incorporated by reference.

Very briefly, U.S. Pat. No. 5,091,893 discloses an array ultrasonic transducer structure in which a high density interconnect (HDI) structure is employed for signal conductor connections to the individual piezoelectric transducer elements. The HDI structure includes a polyimide dielectric film layer, which may comprise Kapton polyimide at a thickness of about 0.001 to 0.003 inch (25 to 75 microns) and available from E.I. DuPont de Nemours & Company, Wilmington, Del. Parallel conductors comprising a patterned metallization layer are formed on the dielectric film layer and connected to the piezoelectric elements through via-holes in the dielectric film layer.

In the disclosure of U.S. Pat. No. 5,091,893, the HDI structure is fabricated directly on a body of piezoelectric material by a process including various laser drilling, metallization and patterning steps, to form an array ultrasonic transducer precursor. Insofar as the present invention is concerned, a similar array ultrasonic transducer precursor may be formed by separately forming a so-called flex circuit comprising a dielectric film layer with patterned conductors, and then laminating the flex circuit to the body of piezoelectric material.

In either event, what results is an array ultrasonic transducer precursor including a body of piezoelectric material with a dielectric substrate bonded to a surface thereof, and a plurality of physically parallel signal conductors arranged in a pattern supported on the dielectric substrate. Thus, in a typical transducer fabrication process, electrical connections between the signal conductors and what will ultimately become the individual piezoelectric elements are made prior to the dicing cuts which define the individual, isolated piezoelectric elements. The dicing saw not only cuts the piezoelectric material, forming a narrow kerf between adjacent elements, but also runs between the parallel signal conductor tracks, cutting away portions of the dielectric substrate. Dicing saw alignment is thus with reference to the conductor pattern supported by the flex circuit; the precise locations of the dicing saw cuts in the body of piezoelectric material are a result of the saw position with reference to the pattern of parallel signal conductors.

Extremely close tolerances are involved. As an example of transducer design employing relatively small elements, the saw kerfs are 40 microns wide, on a pitch of 300 microns. Between each pair of kerfs, two signal traces extend to the left and two to the right. Each trace is connected to one piezoelectric element by means of a via-hole through the flex circuit. A typical pad around the via-hole is 100 microns in diameter. A 60 micron wide gap exists between the via pads on the upper edge of one row of elements and the via pads on the lower edge of the next row of elements. If the dicing saw is to pass between via pads without damaging them, a tolerance of ±10 microns is required for the alignment of the saw with reference to the flex circuit.

However, as noted above, in a typical fabrication process, electrical connections are made early in the process, while the isolation is performed later, after the electrical connections have been encapsulated. The encapsulating materials are generally opaque, so it is difficult to precisely align the isolation cuts with the element pattern established by the electrical connections.

Prior to the present invention, optical alignment was relied upon, employing optical fiducial points or marks formed on a portion of the flex circuit which extends beyond the piezoelectric element and which is removed as a subsequent step in the fabrication process. An optical microscope is conventionally included as part of a dicing saw and is employed for alignment purposes. The optical fiducial points are precisely positioned with reference to the pattern of parallel signal conductors. Since the piezoelectric material is opaque, the optical fiducial points must be located far from the pattern of signal conductors, so that the optical fiducials are visible from the front of the transducer during the alignment and cutting process. After initial fixturing of an array ultrasonic transducer in the dicing saw, an optical alignment is performed by employing the microscope and the optical fiducials. Based on these measurements, rotational and translational offsets, as well as a translational pitch, are calculated for the isolation cuts relative to the fiducial points.

However, because the optical fiducial points are far from the pattern of signal conductors, distortions in the flex circuit during the transducer assembly and dicing processes lead to inaccuracy in the alignment of the saw blade relative to the signal conductors. As a result, the optical alignment method only allows positioning of the saw blade within ±30 micron accuracy.

For some transducer designs, particularly those employing relatively small elements, the yield when employing optical alignment is less than desirable. One reason is that the optical fiducials do not remain co-planar with the pattern of signal conductors, and may be distorted when viewed from the front or back of the transducer during the optical alignment process.

SUMMARY OF THE INVENTION

Accordingly, one object of the invention is to provide an improved technique for alignment of a dicing saw employed to define elements of an array ultrasonic transducer.

Another object of the invention is to provide an alignment technique which can enhance the accuracy of alignment following an initial alignment employing optical techniques.

Briefly, in accordance with a preferred embodiment of the invention, in addition to parallel signal conductors on a flex circuit, a set of patterned conductors comprising resistive elements are formed in predetermined known positions with reference to the pattern of signal conductors, typically in four corners of the flex circuit. The resistive alignment elements are arranged for removal of portions of the elements by an initial cut with a dicing saw such that the initial cut location with reference to the resistive alignment elements can be determined by measurement of the resistances of the resistive alignment elements at least after the initial cut.

Thus, during fabrication, an array ultrasonic transducer precursor is fixtured to the dicing saw, and initially optically aligned. Preferably, before cutting, a set of "before" resistance measurements of the resistive alignment elements are made. Then, one initial cut with the dicing saw is made at each end of the transducer precursor through the dielectric substrate of the flex circuit. Without removing the transducer precursor from the dicing saw, "after" resistance measurements of the resistive alignment elements are made. The change in resistance (i.e., an increase) between the "before" and "after" measurements is then employed to provide a highly accurate indication of the position of the cuts with reference to the resistive alignment elements, and therefore with reference to the parallel signal conductors. Under some circumstances, "after" resistance measurements by themselves are sufficient. This information is then used to appropriately rotate and translate the transducer precursor with reference to the dicing saw blade prior to making the actual dicing cuts through the piezoelectric material body.

In accordance with a more specific aspect of the invention, a method for alignment of a dicing saw employed to define elements of an array ultrasonic transducer comprises providing a transducer precursor including a body of piezoelectric material and a dielectric substrate bonded to a surface of the body and supporting circuit elements. The circuit elements include, in an active region, a plurality of physically parallel signal conductors arranged in a pattern and spaced apart from each other. Outside the active region the circuit elements include a set of resistive alignment elements in predetermined and known positions with reference to the signal conductor pattern. The transducer precursor is mounted in a dicing saw fixture and alignment of the precursor is optically adjusted with reference to the dicing saw. At least one initial cut is then made with the dicing saw to remove portions of the resistive alignment elements. The resistances of the resistive alignment elements, at least after the initial cut, are measured to determine the initial cut location with reference to each of the resistive alignment elements. Prior to making subsequent dicing saw cuts in the spaces between the signal conductors, the transducer alignment with reference to the dicing saw is appropriately adjusted based on the determined location of the edge of the initial cut or cuts.

In accordance with another aspect of the invention, an array ultrasonic transducer precursor includes a body of piezoelectric material and a dielectric substrate bonded to a surface of the body, the dielectric substrate supporting circuit elements. The circuit elements include, in an active region of the substrate, a plurality of physically parallel signal conductors arranged in a pattern with spaces between the signal conductors. The circuit elements outside the active region include a set of resistive alignment elements in predetermined known positions with reference to the pattern of signal conductors. The resistive alignment elements are arranged for removal of portions thereof by an initial cut with a dicing saw, whereby the initial cut location with reference to the resistive alignment elements can be determined by measurement of the resistances of those elements at least after the initial cut.

In one form, each of the resistive alignment elements comprises an elongated resistor extending parallel to the signal conductors and arranged for removal of a lateral portion by the initial cut.

In accordance with yet another aspect of the invention, a system for alignment of a dicing saw employed to define elements of an array ultrasonic transducer includes electrical connection apparatus for making electrical connections to a set of resistive alignment elements included in an array ultrasonic transducer precursor generally as summarized above. The system also includes measurement apparatus for measuring the resistances of the resistive alignment elements at least after an initial cut to remove portions of the resistive alignment elements with a dicing saw, and a computing device coupled to the measuring apparatus for determining the initial cut location with reference to the resistive alignment elements, and for calculating dicing saw alignment adjustments for improved alignment.

BRIEF DESCRIPTION OF THE DRAWINGS

The features of the invention believed to be novel are set forth with particularity in the appended claims. The invention, however, both as to organization and method of practice, together with further objects and advantages thereof, may be best understood by reference to the following description taken in conjunction with the accompanying drawings in which:

DETAILED DESCRIPTION

Figure 1:
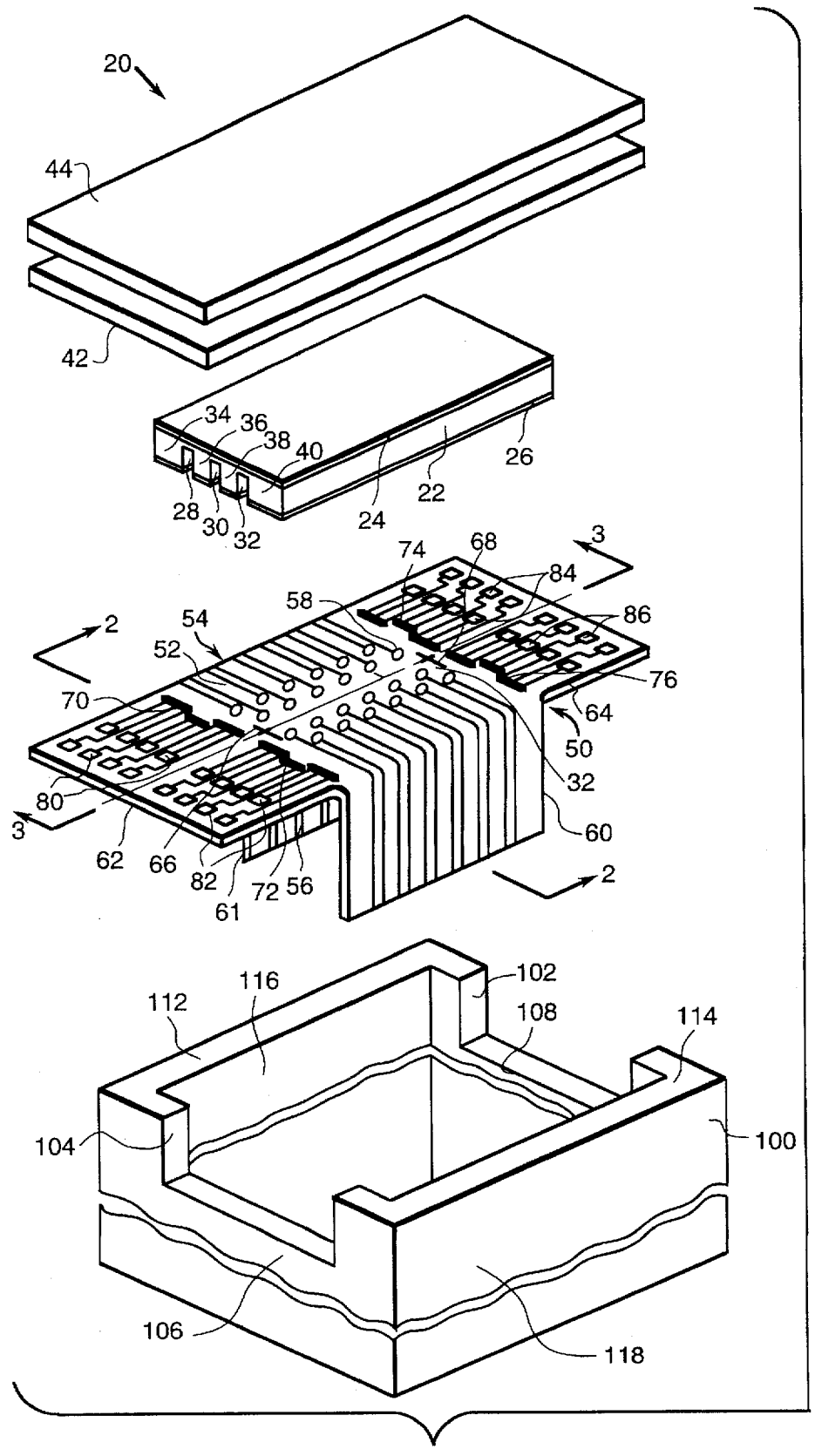
FIG. 1 is an exploded three dimensional view of an array ultrasonic transducer precursor being assembled, prior to dicing to define individual piezoelectric elements.

FIG. 1 depicts various elements of an array ultrasonic transducer precursor 20, which also may be referred to as a pallet 20, prior to lamination and encapsulation. In the orientation of FIG. 1, the top of precursor 20 will ultimately become the "front" or active side of the final array ultrasonic transducer, and the bottom of precursor 20 will become the "back" of the transducer. It is understood, of course, that FIG. 1 is not to scale, as various elements depicted are altered in relative size for purposes of illustration.

Transducer precursor 20 includes, as its active element, a body of piezoelectric material 22, with metallization 24 and 26 on its two major surfaces. By way of example, piezoelectric material body 22 may be 35 mm long by 20 mm wide, with a thickness of 0.35 mm. In the particular transducer configuration depicted, portions of metallization 24 facing the "front" of the transducer and which remain at the conclusion of the fabrication process serve as signal ground electrodes, and portions of metallization 26 which remain at the conclusion of the fabrication process serve as individual signal electrodes for the piezoelectric elements. In the fabrication stage depicted in FIG. 1, piezoelectric material body 22 has already undergone three preliminary "isolation cuts" 28, 30 and 32 made from the rear side, approximately 0.25 mm into the 0.35 mm thickness of piezoelectric body 22. Isolation cuts 28, 30 and 32 thus define four isolated rows or subarrays 34, 36, 38 and 40 within piezoelectric material body 22.

Laminated to the front of piezoelectric material body 22 are first and second acoustic matching layers 42 and 44. Matching layer 42 comprises graphite and serves to make a signal ground electrical connection to metallization layer 24. Matching layer 44 comprises a plastic, such as acrylic. As part of final transducer assembly, subsequent to dicing to define the piezoelectric elements, a suitable acoustic lens (not shown) is attached to matching layer 44.

For making electrical connections to the signal electrodes comprising portions of metallization layer 26 which remain at the end of the fabrication process, a flex circuit, generally designated 50, is provided. Flex circuit 50 includes a dielectric substrate 52, such as Kapton polyimide dielectric film having a thickness of between 0.001 and 0.003 inches (25 to 75 microns), supporting in an active region 54 a plurality of physically parallel signal conductors 56 (generally on the underside of dielectric substrate 52 in the orientation of FIG. 1), terminating in via-holes 58 through which electrical connections to portions of metallization 26 are made. Flex circuit 50 may either be fabricated directly on a surface of piezoelectric material body 22 as is described in the above-incorporated Smith et al U.S. Pat. No. 5,091,893, or may be formed separately and then laminated to piezoelectric material body 22. Flex circuit 50 is shown in greater detail in FIGS. 9 and 10, described hereinbelow.

Outside active region 54, sides 60 and 61 of flex circuit 52 extend at right angles to active region 54 towards the back of the ultimate transducer (actually for a much greater distance than is suggested by the representation of FIG. 1) for ultimate connection of the ends of the conductors 56 to coaxial cables (not shown) which couple the transducer to an ultrasound imaging system. Also outside active region 54 flex circuit end tabs 62 and 64 extend in the same plane as active region 54, and support features employed for alignment purposes.

To facilitate optical alignment of a dicing saw, a pair of optical fiducials 66 and 68 are also supported on dielectric substrate 52, more particularly on end tabs 62 and 64, and are formed and patterned as part of the same process which forms parallel signal conductors 56. Fiducials 66 and 68 are thus situated in known locations with reference to signal conductors 56. Signal conductors 56, as well as optical fiducials 66 and 68, are on the underside of dielectric substrate 52 in the orientation of FIG. 1.

Also supported on dielectric substrate 52, immediately outside active region 54, is a set of, for example, four resistive alignment elements 70, 72, 74 and 76 electrically connected to respective associated probe pad sets 80, 82, 84 and 86. Pad sets 80 and 82 are situated on end tab 62 and pads 84 and 86 are situated on end tab 64. Resistive alignment elements 70, 72, 74 and 76 are described in greater detail hereinbelow with reference to FIGS. 4–8.

Figure 3:
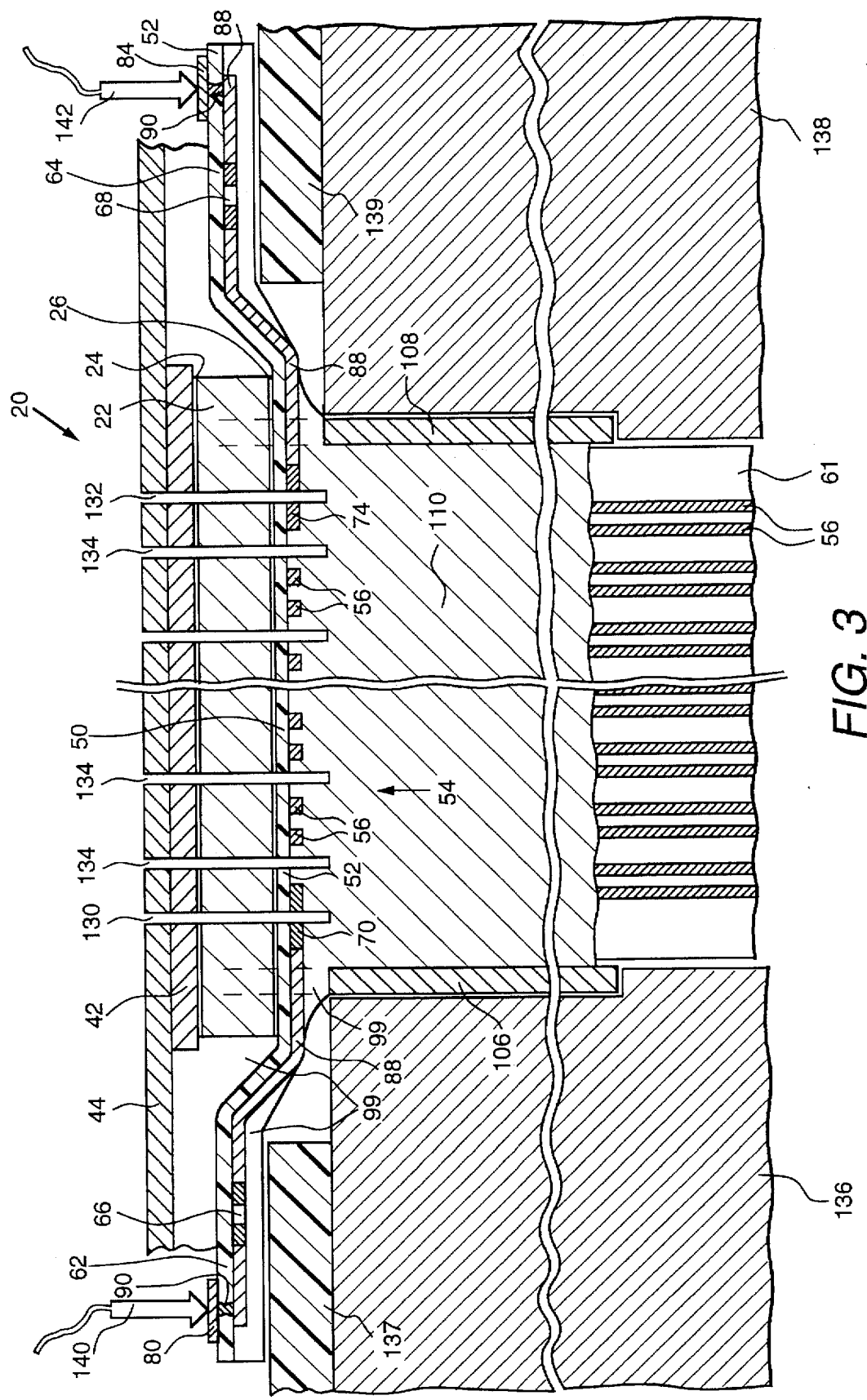
FIG. 3 is a cross sectional view of the transducer precursor of FIG. 1, oriented generally along line 3—3 in FIG. 1, representing the array ultrasonic transducer precursor, still fixtured in the dicing saw, after the dicing operation.

Resistive alignment elements 70, 72, 74 and 76 may conveniently comprise metallized conductive traces, such as copper, formed on dielectric substrate 52 at the same time as signal conductors 56, and accordingly are accurately defined in predetermined known positions with reference to the pattern of signal conductors 56. Resistive alignment elements 70, 72, 74 and 76 are likewise formed on the underside of dielectric substrate 52 in the orientation of FIG. 1, and associated probe pad sets 80, 82, 84 and 86 are on the top of substrate 52, electrically connected through signal conductors 88 and via holes 90, as shown in FIG. 3.

Figure 2:
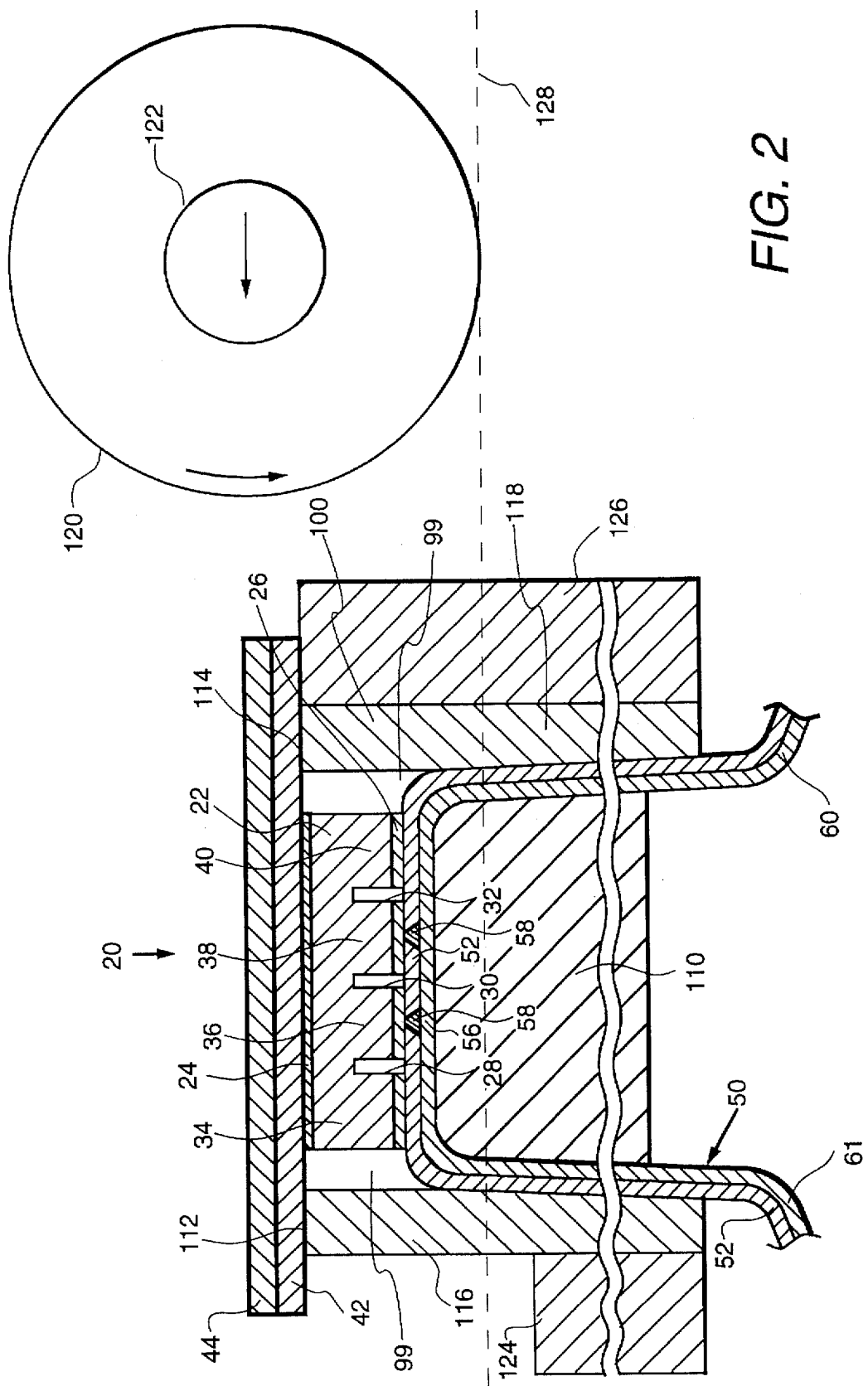
FIG. 2 is a cross sectional view of the transducer precursor of FIG. 1, oriented generally along line 2—2 in FIG. 1, representing the array ultrasonic transducer precursor fixtured in a dicing saw.

Referring to FIG. 2 in addition to FIG. 1, piezoelectric material body 22 and flex circuit 50 are inserted into a conductive graphite case 100 having suitable recesses 102 and 104 in its respective end walls 106 and 108 for receiving the piezoelectric body. Matching layers 42 and 44, piezoelectric material body 22, flex circuit 50 and graphite case 100 are bonded together, such as by an epoxy adhesive 99, illustrated in FIG. 2. Sides 60 and 61 of flex circuit 50 extend into case 100 which is then partially filled, as shown in FIG. 2, with a suitable acoustic backing material 110, for example a conventional epoxy-based mixture such as described in M. S. Horner et al. U.S. Pat. No. 4,779,244, issued Oct. 18, 1988 and assigned to the instant assignee. The backing material may be approximately 5 mm thick.

Graphite matching layer 42 is bonded to upper surfaces 112 and 114 of case 100 side walls 116 and 118, respectively, thus completing an electrically conductive grounding path from case 100 to ground metallization 24.

Also represented in FIG. 2 are portions of a dicing saw, such as a Model No. DAD-2H/5 automatic dicing saw, available from Disco Abrasive Systems, Inc., Mountain View, Calif. The dicing saw includes a very fine diamond blade 120 mounted on an arbor 122, and a precisely positionable carriage or table (not shown) on which a suitable fixture, represented by fixture elements 124 and 126 is mounted. More particularly, transducer case 100 is securely held between permanent fixture element 124, which may be comprised of steel, and sacrificial fixture element 126, which may be comprised of a graphite block. Suitable screw clamps (not shown) are provided for urging sacrificial block 126 against case 100. Saw cut depth as precursor 20 moves past saw blade 120 is indicated by dash line 128. The arrow on arbor 122 signifies the direction of relative movement of the arbor in relation to precursor 20.

A dicing saw is a precision instrument, intended for dicing semiconductor wafers, for example, as well as other materials, and is capable of saw blade positioning accuracies on the order of ±0.002 mm. Movements of saw blade 120 its saw carriage (not shown) are precisely controlled by a microprocessor-based control system (not shown) included as part of the dicing saw. The saw carriage, upon which fixture elements 124 and 126 are mounted, rotates for adjustment purposes, and translates along an axis parallel to saw blade 120 for the purpose of making cuts. In addition, arbor 122 moves in and out in a direction perpendicular to the saw cuts for the purpose of repositioning saw blade 120 relative to transducer precursor 20 between cuts, and also for initial alignment purposes.

FIG. 3, which is a cross section taken at right angles with reference to FIG. 2, depicts transducer precursor 20 after dicing. More particularly, FIG. 3 illustrates a pair of initial saw cuts 130 and 132 made for alignment purposes to remove portions of representative alignment elements 70 and 74, and further illustrates subsequent dicing saw cuts 134 through matching layers 42 and 44, piezoelectric material body 22, and dielectric material layer 52, slightly into backing material 110.

Additional steel endpiece fixture elements 136 and 138 are visible in FIG. 3, on which there is a pair of support strips 137 and 139, which may for example comprise a plastic tape, and which support flex circuit end tabs 62 and 64 below probe pad sets 80, and 84.

Also shown in FIG. 3 are a pair of representative probes 140 and 142 in contact with corresponding representative probe pads 80 and 84 for making electrical connection to representative resistive alignment elements 70 and 74.

At the conclusion of the fabrication steps represented in FIGS. 1-3, excess portions of flex circuit 50 are trimmed flush with the sides of case 100, particularly end tabs 62 and 64, as are excess portions of matching layers 42 and 44.

To briefly describe a typical dicing operation prior to the present invention, a pallet or transducer precursor is mounted in a fixture, with the matching layers up. An optical microscope is used to align the dicing saw to the flex circuit, the microscope being an integral part of the dicing saw. Before cutting a pallet, lines on a reticle in the microscope are carefully aligned to a saw kerf cut in a piece of scrap material. Then the transducer pallet is mounted on the saw and a fiducial on the precursor is aligned with the reticle in the microscope. The saw is then moved a certain distance from the fiducial and a series of cuts are made into the part. The distance from the fiducial to the first cut and the distance between cuts must be determined by measuring the flex circuit.

Figure 4:
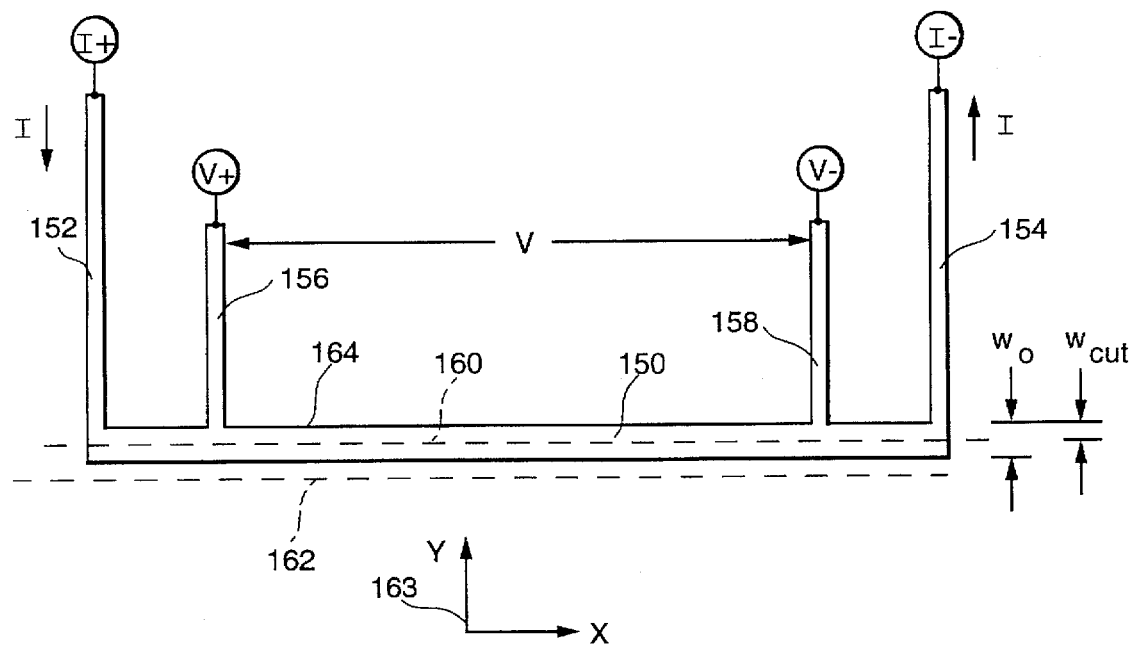
FIG. 4 is a plan view of one form of resistive alignment element in accordance with the invention.

Considering resistive alignment elements 70, 72, 74 and 76 in greater detail, FIG. 4 illustrates an example of a typical flex-circuit resistive element or resistor 150 having leads 152, 154, 156, and 158. Resistor 150 corresponds to any one of resistive elements 70, 72, 74, or 76 and may conveniently comprise a patterned trace of known length and uniform width on flex circuit 50. For example, with a copper metallization thickness of four microns, a typical trace resistance is about 4.5 milliohms per square. To obtain useful accuracy, this resistance is measured using a four-terminal configuration. Accordingly, a current I is driven from one terminal I+ to another terminal I– through current leads 152 and 154, and voltage drop V across resistor 150 is measured across terminals V+ and V– through voltage leads 156 and 158. By Ohms law, resistance R=V/I. To avoid undesirable regions of non-uniform current distribution, voltage leads 156 and 158 are located at least two or three trace widths inside current leads 152 and 154. The effective length of resistor 150 is the distance between voltage leads 156 and 158.

The measured resistance will be R=ρl/wt, where ρ is the electrical resistivity of the copper, and l, w and t are the length, width and thickness, respectively, of resistor 150. If all other factors are constant, then R∝l/w.

In FIG. 4, the dicing saw kerf is represented by dash lines 160 and 162, and resistor 150 is positioned so that a portion thereof is removed by saw kerf 160,162, thus increasing the resistance by an amount which is determined by the amount of material removed and therefore is dependent on the location of saw kerf 160,162 with reference to resistor 150. In FIG. 4, the initial width of resistor 150 is designated $w_o$, and the width after cutting is designated $w_{cut}$. A Cartesian coordinate system 163 is employed in FIG. 4 (as well as in FIGS. 5–8 described hereinbelow). Thus an x-axis is horizontal on the page, and a y-axis is vertical on the page.

From the initial width $w_o$ of resistor 150 and the y coordinate position $y_{uncut}$ of its uncut edge 164 to which leads 152, 154, 156 and 158 are attached, and from measurement of the resistance before ($R_o$) and after ($R_1$) cut 160,162, the y coordinate position $y_{cut}$ of one edge 160 of saw cut 160,162 can be determined:

$$R_o \ w_o = R_1 \ w_{cut} = R_1 \ (y_{uncut} - y_{cut}) \tag{1}$$

$$y_{cut} = y_{uncut} - \frac{R_o}{R_1} \ w_o \tag{2}$$

Figure 5:
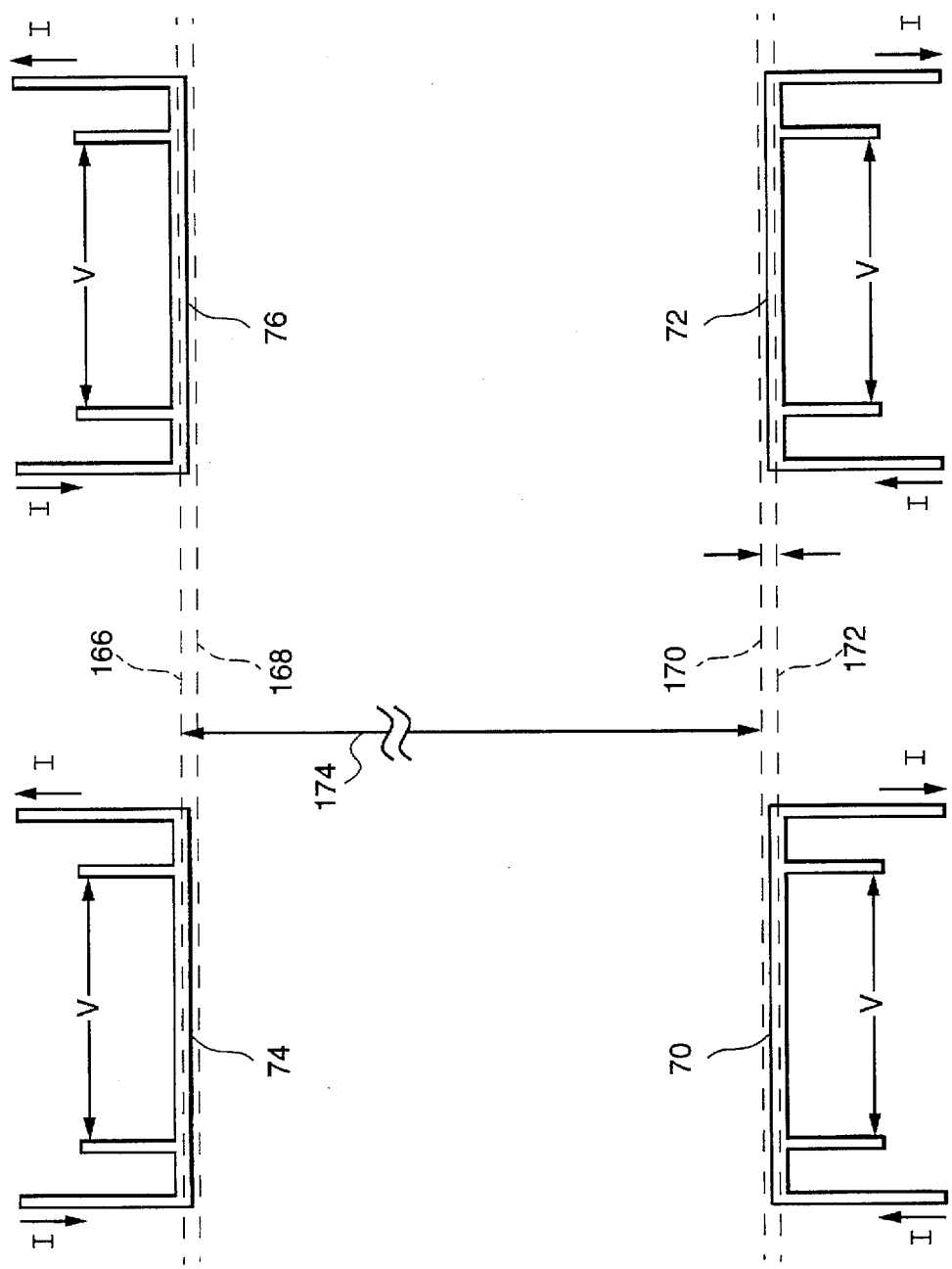
FIG. 5 is a plan view of a set of four resistive alignment elements like that of FIG. 4, at four corners of a flex circuit.

With reference to FIG. 5, by locating resistive alignment elements 70, 72, 74 and 76, such as resistor 150 of FIG. 4, in the corners of flex circuit 50 immediately outside active region 54 (FIG. 1), the locations of two saw cuts 166,168 and 170,172 may be determined. For example, measurement of resistor 70 determines the y coordinate position $y_{70}$ of the position of lower edge 172 of lower cut 170,172. This measurement is an average over the length of resistor 70, the x coordinate of the midpoint of which is $x_{70}$. Given results $(x_i, y_i)$ from each of the four resistors, the following is derived:

$$\text{Offset} = \frac{y_{70} + y_{72}}{2} + \frac{\text{Cut Width}}{2} \tag{3}$$

$$\text{Pitch} = \frac{y_{74} + y_{76}}{2} - \frac{y_{70} + y_{72}}{2} - \text{Cut Width} \tag{4}$$

$$\text{Theta} = \arctan\left(\frac{y_{72} - y_{70} + y_{76} - y_{74}}{x_{72} - x_{70} + x_{76} - x_{74}}\right) \tag{5}$$

where:

$y_{72}$ is the y coordinate of the position of the lower edge 172 of lower cut 170,172 removing a portion of resistor 72;

$x_{72}$ is the x coordinate of the midpoint of resistor 72;

$y_{74}$ is the y coordinate of the position of the upper edge 166 of upper cut 166,168 removing a portion of resistor 74;

$x_{74}$ is the x coordinate of the midpoint of resistor 74;

$y_{76}$ is the y coordinate of the position of the upper edge 166 of upper cut 166,168 removing a portion of resistor 76;

$x_{76}$ is the x coordinate of the midpoint of resistor 76;

Offset is the position of the center of lower cut 170,172 relative to the origin of the coordinate system;

Pitch is the center-to-center distance between cuts 166, 168 and 170,172 as indicated by dimension line 174; and Theta is the angle of cuts 166,168 and 170,172, measured counterclockwise from the horizontal or x axis.

The resistor design and measurement technique described hereinabove with reference to FIGS. 4 and 5 assume ideal conditions. Practical implementations preferably include additional features to allow compensation for the most likely non-idealities.

The first assumption which must be compensated for in view of non-ideal conditions in a practical implementation is that resistivity of the traces on flex circuit 50 will remain constant. Equation (2) above for the coordinate position $y_{cut}$ of one edge 160 of saw cut 160,162 requires comparison of pre-cut and post-cut measurements $R_0$ and $R_1$ of a single resistor. The resistivity of copper however changes by about 10% between room temperature and 0° C. If the transducer precursor is chilled significantly during cutting, an error is introduced.

Figure 6:
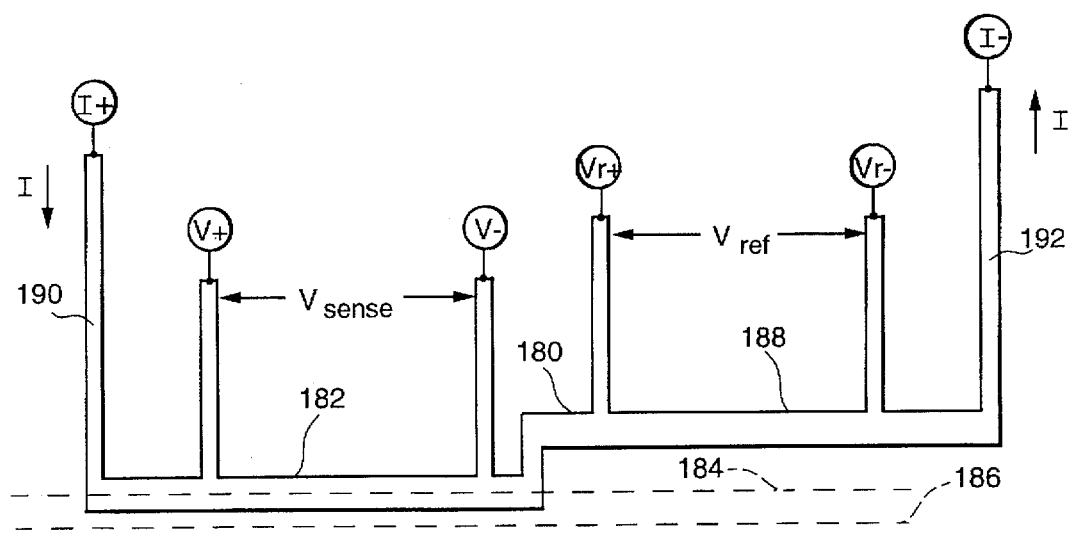
FIG. 6 is a plan view of another form of resistive alignment element, including a reference resistor.

FIG. 6 illustrates a resistive alignment element 180 which embodies a resistivity compensation technique. Resistive alignment element 180 includes a measurement or sense resistor 182 which is positioned so as to have a portion removed by a saw kerf 184, 186, and a substantially identical reference resistor 188 which is not cut. To reduce the number of leads required, resistors 182 and 188 share a common current path, driven from terminal I+ to terminal I− through current leads 190 and 192. Terminals V+ and V− are provided for sensing voltage drop $V_{sense}$ across sense resistor 182, and terminals Vr+ and Vr− are provided for sensing voltage drop $V_{ref}$ across reference resistor 188.

Since resistors 182 and 188 are in close proximity they experience very similar processing conditions during flex circuit fabrication and similar temperatures during use. Their resistivities can be expected to be equal. In this case, the resistance of sense resistor 182 can be expressed as:

$$R_s = \rho \frac{l_s}{w_s t_s} = R_r \frac{w_r t_r}{l_r} \cdot \frac{l_s}{w_s t_s}, \qquad (6)$$

where subscript r identifies properties of the reference resistor. Because all geometric quantities, except the width of sense resistor 182, are constant, the above equation may be rewritten as:

$$w_s = \text{const} \frac{R_r}{R_s}. \qquad (7)$$

The constant const may be determined from measurements of $R_r$, $R_s$, and $w_s$ before the initial alignment cut or cuts, and should be independent of temperature changes during the alignment cut.

Thus, before cutting, the width $w_s$ of sense resistor 182, the y coordinate position $y_{uncut}$ of the uncut edge of sense resistor 182, the resistance $R_{s,uncut}$ of sense resistor 182, and the resistance $R_r$ of reference resistor 188 are measured. The constant is calculated as $$\text{const} = w_s \frac{R_{s,uncut}}{R_r}. \qquad (8)$$

After the initial alignment cut or cuts, the resistance $R'_{s,cut}$ of sense resistor 182 after cutting and the resistance $R'_r$ of reference resistor 188 are measured, where the prime marks (') indicate resistance measurements made after a possible temperature change from before cutting.

Equation (2) can be rewritten with variables renamed as follows:

$$y_{cut} = y_{uncut} - \frac{R'_{s,uncut}}{R'_{s,cut}} w_s. \qquad (9)$$

From Equation (8), $$R'_{s,uncut} = \frac{\text{const}}{w_s} R'_r. \qquad (10)$$

Substituting Equation (10) into Equation (9) gives:

$$y_{cut} = y_{uncut} - \text{const} \frac{R'_r}{R'_{s,cut}}. \qquad (11)$$

If it is assumed that $R_r = R_{s,uncut}$ under all conditions (temperature and other conditions), then $\text{const} = w_s$ and $y_{cut}$ may be determined without measuring any resistances prior to cutting, i.e. $R_{s,uncut}$ and $R_r$. Thus $$y_{cut} = y_{uncut} - \frac{R'_r}{R'_{s,cut}} w_s. \qquad (12)$$

Reliance on this assumption produces results which are somewhat less accurate, but may involve a more efficient procedure. Based on experiments, with careful fabrication, $R_{s,uncut} \approx R_r \pm 1\%$, although there are occasional variations to ±4%. By way of contrast, $R_{s,cut}$ is typically within the range of 1.5 to 2.0 times $R_r$.

Figure 7:
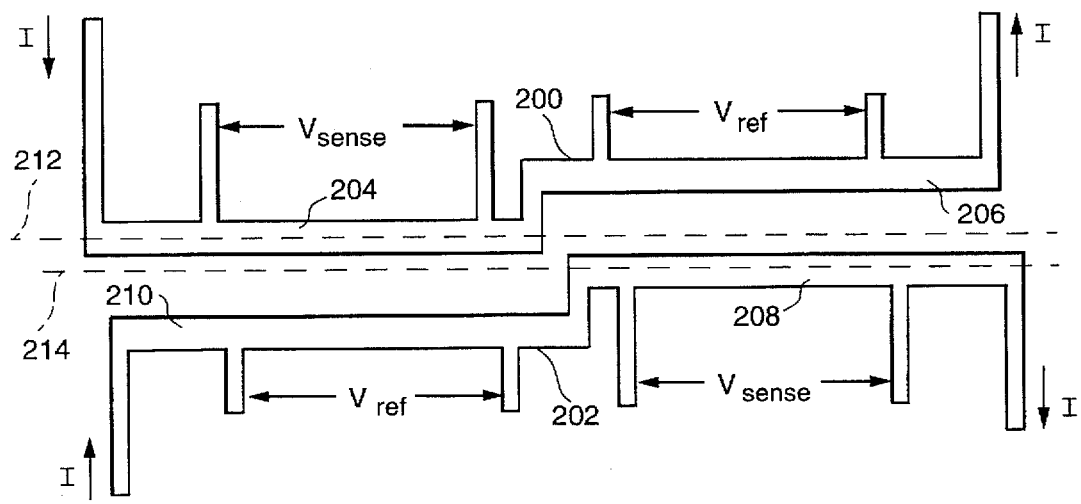
FIG. 7 is a plan view of a pair of resistive alignment elements arranged for measuring the width or kerf of a saw cut.

A second assumption which may be compensated for in a practical implementation is that the saw kerf width is known. Determination of pitch and offset, as described hereinabove with reference to FIGS. 4 and 5, depends on independent knowledge of the saw kerf width. For measuring width of the alignment cuts in-process, two sets 200 and 202 of resistors may be used to measure both edges of the cut, as shown in FIG. 7. Thus set 200 includes a sense resistor 204 and a reference resistor 206 corresponding, respectively, to resistors 182 and 188 of FIG. 6, and set 202 likewise includes a sense resistor 208 and a reference resistor 210. A saw kerf 212,214 removes portions of sense resistors 204 and 208. Resistor pattern 200 is then used to determine the position of cut edge 212, and resistor pattern 202 is used to determine the position of cut edge 214. The width of saw kerf 212,214 is then the distance between the two cut edges 212 and 214. Since the two resistor patterns 200 and 202 are in close proximity on the flex circuit, one of reference resistors 206 and 210 could be eliminated to reduce the number of leads.

Figure 8:
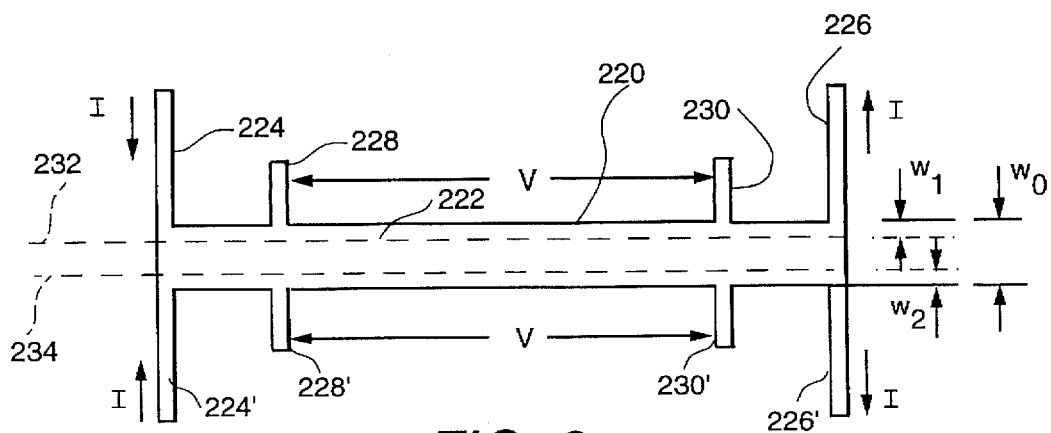
FIG. 8 is a plan view of yet another form of resistive alignment element.

An alternative resistive alignment element 220 is shown in FIG. 8. This embodiment advantageously provides a more sensitive position determination because two resistances $R_1$ and $R_2$ are involved, one of which increases while the other decreases. Before cutting, element 220 is a single, relatively wide ($w_o$) resistor 222 with redundant sets 224,226 and 224',226' of current leads, and redundant sets 228,230 and 228',230' of voltage leads. After saw kerf 232,234 passes through, there are two separate resistors ($R_1$, $R_2$ of respective width $w_1$, $w_2$). Using k for the width of the saw kerf, $y_o$ for the y coordinate of the center of initial resistor 222, and $y_{cut}$ for the y coordinate of the center of the cut 232, 234, we have:

$$R_i w_i = \frac{\rho t}{t} \qquad (13)$$

$$w_o = w_2 + k + w_1 = k + \frac{\rho l}{t}\left(\frac{1}{R_2} + \frac{1}{R_1}\right) \qquad (14)$$

-continued $$y_{cut} - y_o = \frac{1}{2}(w_2 - w_1) = \frac{\rho t}{2t}\left(\frac{1}{R_2} - \frac{1}{R_1}\right) \quad (15)$$

$$\rightarrow y_{cut} - y_o = \frac{w_o - k}{2} \frac{R_1 - R_2}{R_1 + R_2} \quad (16)$$

If the kerf width k is known, then $y_{cut}$ may be determined from $R_1$ and $R_2$, without any before-cut measurement of $R_o$.

If the kerf width k is not known, then a nearby reference resistor, with dimensions similar to measurement resistor 220 prior to cutting, should be included in the flex circuit. Using such a resistor, $$\frac{R_o}{R_{ref}} = \frac{l_o}{w_o t_o} \frac{w_{ref} t_{ref}}{l_{ref}} = \text{const} \quad (17)$$

$$k = w_o - w_1 - w_2 = w_o\left(1 - \frac{R_o}{R_1} - \frac{R_o}{R_2}\right) \quad (18)$$

$$k = w_o\left(1 - \text{const} R_{ref}\left(\frac{1}{R_1} + \frac{1}{R_2}\right)\right). \quad (19)$$

The constant const is determined from measurements of $R_o$ and $R_{ref}$ before dicing and should be temperature independent. All resistance values appearing explicitly in the equations for k and $y_{cut}$ are measured after dicing, at the same time and temperature.

Figure 9:
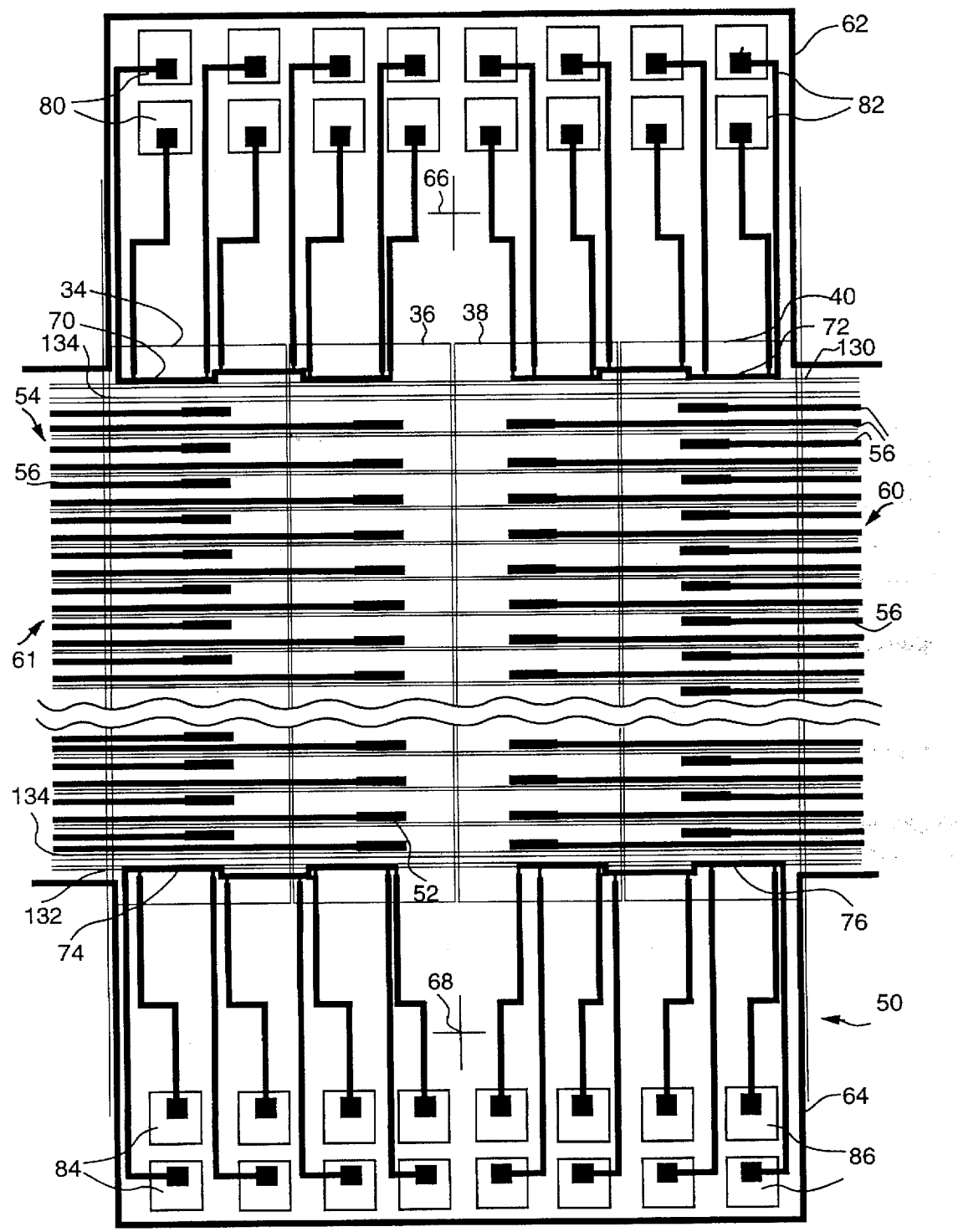
FIG. 9 is a plan view of a flex circuit supporting parallel signal conductors and resistive alignment elements in accordance with the invention.
Figure 10:
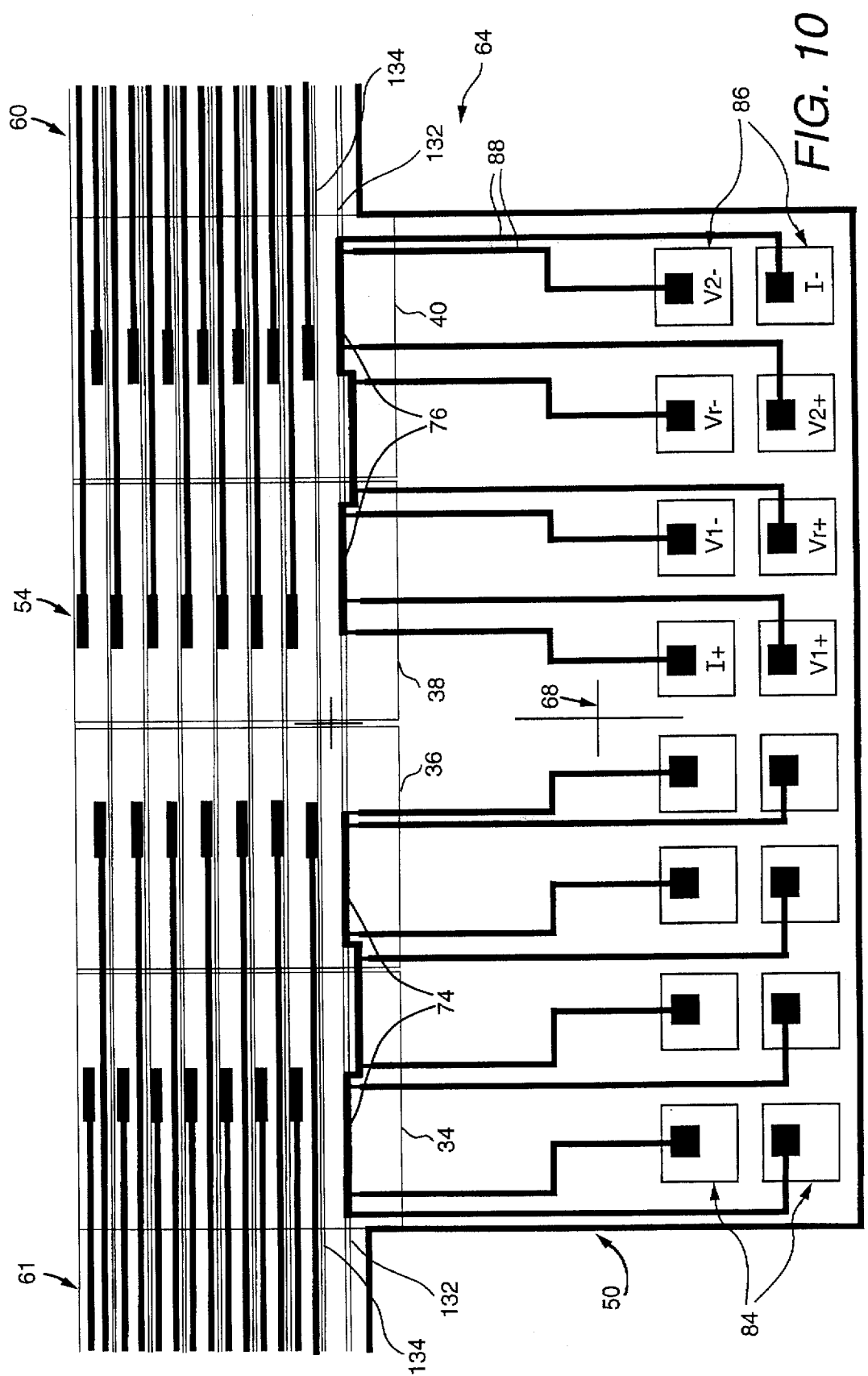
FIG. 10 is an enlarged view of one end of the flex circuit of FIG. 9.

FIGS. 9 and 10 show a practical implementation of the invention, FIG. 10 being an enlarged view of the lower portion of FIG. 9. FIGS. 9 and 10 are viewed generally from the underside of flex circuit 50 as oriented in FIG. 1, with the "back" of piezoelectric material body 22 facing up out of the page, and with flex circuit 50 on top. Thus outlines of subarrays 34, 36, 38 and 40 defined in ceramic piezoelectric material body 22 by isolation cuts 28, 30 and 32 (FIGS. 1 and 2) are visible in active region 54.

Horizontal saw kerfs 134 (made from below in the orientation of FIGS. 9 and 10 and from above in the orientation of FIGS. 1-3) divide each piezoelectric subarray 34, 36, 38, 40 into 128 elements, plus two dummy elements at each end. Additionally shown in FIG. 9 are the two initial saw cuts 130 and 132 made for alignment purposes to remove portions of resistive alignment elements 70, 72, 74 and 76, as described hereinabove.

Signal conductors 56 (horizontal) begin at each piezoelectric element and extend left or right along substrate 52 to pads (not shown) for eventual connection to a coaxial cable assembly. Tabs 62 and 64 extending from the flex circuit contain features used for aligning the dicing saw to the flex circuit and are cut off after all of the elements have been diced.

In the example shown in FIG. 9, the saw kerfs are 40 microns wide on a pitch of 300 microns. Between each pair of kerfs, two signal traces extend to the left and two to the right. Each trace is connected to one piezoelectric element through a respective via-hole in the flex circuit. The pad around each via-hole is 100 microns wide. There is a 60 micron gap between the via pads on the upper edge of one row of elements and the via pads on the lower edge of the next row of elements. For the saw to pass between these via pads without damaging them, a tolerance of ±10 microns is provided for the alignment of the saw to the flex circuit.

Resistive alignment elements 70, 72, 74 and 76 of FIGS. 9 and 10 are similar to resistive alignment element 180 of FIG. 6, except that an extra sense resistor has been added to each pattern. The resistive alignment elements are employed to determine three parameters of the two initial saw cuts relative to flex circuit 50, i.e., pitch, offset, and rotation. With eight sense resistors, there is some redundancy. By fitting to all the data, a more accurate estimate of the actual dicing parameters can be obtained. If some of the resistors or leads are damaged during the assembly process, accuracy is reduced, but the entire ability to measure the saw cuts remains.

The technique of the invention is intended for achieving fine adjustment of the dicing saw alignment. An initial alignment method, typically optical employing fiducials 66 and 68, is ordinarily required. The capability of the initial alignment method determines the minimum width of the resistor traces of resistive alignment elements 70, 72, 74 and 76, and thereby affects the potential accuracy.

The flex circuit of FIGS. 9 and 10 does not include resistors for measurement of the saw kerfs widths. The first saw cut is only two transducer elements away from the first signal traces, leaving very little room for a resistor pattern and the necessary current and voltage leads. In practice, the saw kerf width has been quite reproducible, varying perhaps ±3 microns from one transducer precursor or pallet to the next. Accordingly, the error introduced by not measuring the saw kerfs during the alignment process is well within alignment tolerances. It is, however, a good practice to measure the saw kerfs after dicing, to ensure that their widths remain within an acceptable range.

If the flex circuit is of multilayer construction, with the signal traces and vias distributed over two or more layers, then all features critical to alignment of the dicing saw preferably are concentrated within one layer. For typical manufacturing processes, each metallization layer and each set of via holes requires a separate respective pattern, which must be carefully aligned to the results of previous patterning steps. If features critical to dicing (the resistors, plus any traces, vias, or via pads which are near the dicing kerfs) are distributed over two or more patterning steps, then the tolerance for dicing alignment must be reduced by the typical range of misalignment of those patterns. Alignment errors of ±10 microns are not unusual.

The representative probe pads 80 and 84 of FIG. 3, may, as shown more particularly in FIGS. 9 and 10, comprise a set of sixteen probe pads 80, 82, 84 and 86 at each end of flex circuit 50, connected to resistive alignment elements 70, 72, 74 and 76 through voltage and current leads as described hereinabove with reference to FIGS. 4, 6 and 8. In FIG. 3, probes 140 and 142 are representative of a corresponding set of thirty-two probes organized into two probe fixtures (not shown) for making connections to probe pads 80, 82, 84 and 86.

Figure 11:
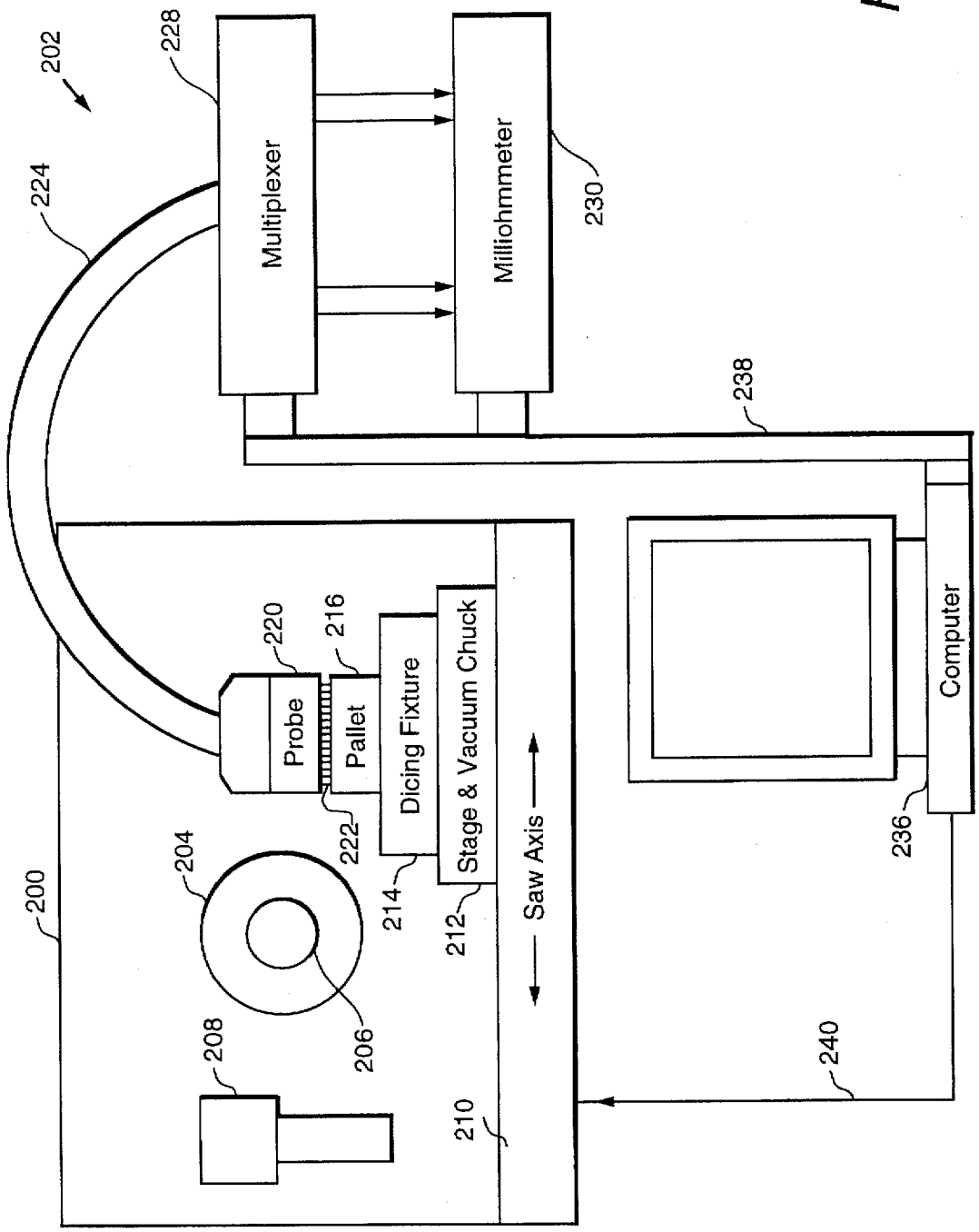
FIG. 11 is a schematic depiction of a dicing saw in combination with a system for alignment of the saw.

FIG. 11, shows, in highly schematic form, a dicing saw 200, and a system 202 for aligning the dicing saw. Dicing saw 200 includes a saw blade 204 mounted on an arbor 206, corresponding to saw blade 120 and arbor 122 of FIG. 2, and a microscope 208 for optical alignment.

Dicing saw 200 additionally includes a saw axis 210 supporting a stage and vacuum chuck 212, which in turn supports a dicing fixture 214. Stage 212 is rotatable and translatable along saw axis 210 under microprocessor control. A transducer precursor or pallet 216, corresponding to transducer precursor 20 as described hereinabove, is retained by dicing fixture 214.

Alignment system 202 more particularly includes measurement apparatus in the form of a probe 220 supporting probe pins 222, corresponding to representative probe pins 140 and 142 of FIG. 3, and connected via voltage and current sense leads 224 to a multiplexer 228 which, under computer control, selects channels for connection to a milliohmmeter 230. By way of example, the milliohmmeter may comprise a Hewlett Packard Model No. HP 4338A, and multiplexer 228 may comprise a Hewlett Packard Model No. HP 3488A containing three Hewlett Packard Model No. HP 44470A relay switch cards.

Connected to the measurement apparatus is a computing device, such as an ordinary personal computer, connected to multiplexer 228 and milliohmmeter 230 through an IEEE-488 bus 238. Computer 236 is appropriately programmed to control multiplexer 228 and milliohmmeter 230, to make appropriate "before" and "after" resistance measurements, and to calculate dicing saw alignment adjustments for improved alignment. Adjustment instructions in the form of corrections to dicing parameters as determined by computer 236 are conveyed to dicing saw 200 along signal path 240.

While only certain preferred features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A method of aligning a dicing saw employed to define elements of an array ultrasonic transducer, comprising:

mounting, in a dicing saw fixture, a transducer precursor including a body of piezoelectric material having a dielectric substrate supporting circuit elements and bonded to a surface of the body, the circuit elements including in an active region a plurality of physically parallel signal conductors arranged in a pattern with spaces between the signal conductors, and including outside the active region a set of resistive alignment elements in predetermined known positions with reference to the pattern of signal conductors;

making at least one initial cut with the dicing saw to remove portions of the resistive alignment elements;

measuring the resistive alignment element resistances at least after the at least one initial cut to determine location of the at least one initial cut with reference to each of the resistive alignment elements; and prior to making subsequent cuts in the spaces between the signal conductors with the dicing saw, appropriately adjusting alignment of the transducer precursor with reference to the dicing saw based on location of the edge of the at least one initial cut.

2. The method of claim 1 and further comprising, prior to making the at least one initial cut with the dicing saw, optically adjusting alignment of the transducer precursor with reference to the dicing saw.

3. The method of claim 1, which further comprises measuring the resistive alignment element resistances before the at least one initial cut, and comparing the measured resistances to determine location of the at least one initial cut with reference to each of the resistive alignment elements.

4. The method of claim 1, wherein:

the transducer precursor mounted in the dicing saw fixture includes a set of resistive alignment elements each having a sense resistor positioned so that a portion thereof is removed by the at least one initial cut, and a reference resistor positioned sufficiently close to the sense resistor so that the reference resistor experiences processing conditions and in-use temperatures similar to those of the sense resistor; and which method further comprises:

measuring resistances of the sense resistors and resistances of the reference resistor, after the at least one initial cut.

5. The method of claim 1, wherein:

the transducer precursor mounted in the dicing saw fixture includes a pair of sense resistors positioned such that respective portions thereof are removed by opposite sides of the at least one initial cut; and which method further comprises:

determining kerf width in accordance with measured resistances of the sense resistors after the at least one initial cut.

6. The method of claim 1, wherein:

the transducer precursor mounted in the dicing saw fixture includes a set of resistive alignment elements, each of said alignment elements comprising a single initial resistor, respectively, which is separated longitudinally into two separate resistors; and which method further comprises:

measuring resistance of each of the two separate resistors of each of said alignment elements after the at least one initial cut.

7. A system for aligning a dicing saw employed to define elements of an array ultrasonic transducer, comprising:

an array ultrasonic transducer precursor including therein a body of piezoelectric material, a dielectric substrate bonded to a surface of the body, circuit elements supported on said dielectric substrate and including, in an active region thereof, a plurality of physically parallel signal conductors arranged in a pattern with adjacent ones of the signal conductors being separated from each other, said circuit elements further including, outside the active region, a set of resistive alignment elements in predetermined known positions with reference to the pattern of signal conductors, said resistive alignment elements being arranged for removal of portions thereof by an initial cut whereby location of the initial cut with reference to the resistive alignment elements can be determined in accordance with measured resistances of the resistive alignment elements after the initial cut, and electrical conductive elements for making electrical connections to said set of resistive alignment elements;

measurement apparatus connected through said electrical conductive elements for measuring resistances of the resistive alignment elements; and computer apparatus coupled to said measurement apparatus for determining location of the initial cut with reference to the resistive alignment elements, and for calculating dicing saw alignment adjustments to improve accuracy of subsequent cut locations.

* * * * *